United States Patent [19]

Jiang et al.

[11] Patent Number: 4,460,978
[45] Date of Patent: Jul. 17, 1984

[54] NONVOLATILE STATIC RANDOM ACCESS MEMORY CELL

[75] Inventors: Ching-Lin Jiang, Dallas; David L. Taylor, Carrollton, both of Tex.

[73] Assignee: Mostek Corporation, Carrollton, Tex.

[21] Appl. No.: 322,915

[22] Filed: Nov. 19, 1981

[51] Int. Cl.³ .............................................. G11C 11/40
[52] U.S. Cl. .................................... 365/154; 365/185; 307/279
[58] Field of Search .................. 365/154, 184, 185; 307/279; 357/23 VT

[56] References Cited

U.S. PATENT DOCUMENTS

| | | | |
|---|---|---|---|
| 4,044,343 | 8/1977 | Uchida | 365/154 |
| 4,103,185 | 7/1978 | Denes | 365/185 |
| 4,122,541 | 10/1978 | Uchida | 365/154 |
| 4,132,904 | 1/1979 | Harari | 365/185 |
| 4,207,615 | 6/1980 | Mar | 365/185 |

Primary Examiner—Stuart N. Hecker

[57] ABSTRACT

A nonvolatile static random access memory cell (10) includes a pair of cross-coupled transistors (12, 14) which function as a bistable circuit to store data states. Variable threshold transistors (36, 41) are respectively connected in series between the driver transistors (12, 14) and load devices (48, 50). A control node (40) is driven to a high voltage state to cause one of the variable threshold transistors (36, 41) to be driven to have a higher threshold voltage and thereby store the data state held in the cross-coupled transistors (12, 14). The data state is thus stored in nonvolatile form. Upon recall the memory cell (10) is reactivated and the threshold differential between the variable threshold transistors (36, 41) causes the driver transistors (12, 14) to be set at the stored data state. The data recalled by the memory cell (10) is in true rather than in complementary form. The variable threshold transistors (36, 41) are reset by driving the power terminal $V_{cc}$ to a high voltage state to reestablish common threshold voltages for the variable threshold voltage transistors (36, 41).

6 Claims, 1 Drawing Figure

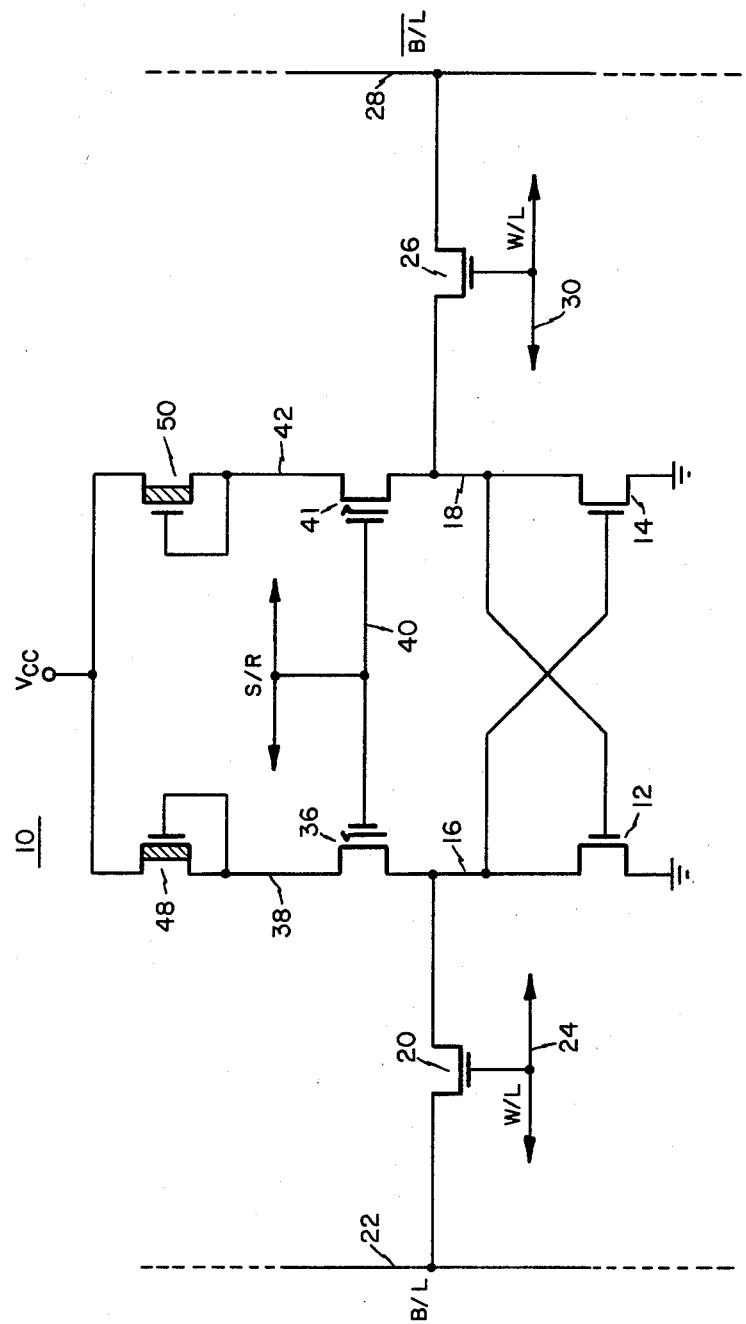

NONVOLATILE STATIC RANDOM ACCESS MEMORY CELL

TECHNICAL FIELD

The present invention pertains to semiconductor memories and in particular to such memories which have nonvolatile storage.

BACKGROUND ART

There is an increasing demand in data processing applications for nonvolatile memory storage. Random access memory cells typically store a data state as either a charge on a small capacitor or as the condition of a bistable circuit. However neither of these storage techniques retains the stored data state when power for the memory cell is removed.

A variable threshold transistor has been developed which can store charge on an insulated gate element to effectively change the threshold voltage of the transistor. This charge storage can be maintained for an extended period of time without external power thus providing nonvolatile data storage. A description of this variable threshold transistor and an application of it in a nonvolatile logic latch circuit is given in U.S. Pat. No. 4,128,773 to Troutman et al.

Conventional nonvolatile storage circuits, such as shown in the Troutman et al patent, can provide extended data storage without external power. However, the data stored in the Troutman et al circuit is in the inverse state rather than the true state. This complicates the control of the memory since additional steps are required to convert the stored data from the inverse to the true state. Since this must be carried out each time that data is recalled the speed of operation of the memory is substantially reduced. The further complexity of working with the inverse rather than the true state of the data can also require that additional circuit elements be used in the memory thus increasing the cost and size of the overall memory array.

In view of the problems of inverse data storage and operating speed, there exists a need for a nonvolatile static random access memory cell which can store the true state of data for an extended period of time, provide a fast read of stored data, require a minimum of operational controls, and utilize a minimum number of circuit elements.

BRIEF DESCRIPTION OF THE INVENTION

A selected embodiment of the present invention comprises a nonvolatile static random access memory cell which includes first and second cross-coupled driver transistors which are connected to have first and second stable states. The first driver transistor has the drain and source terminals thereof connected between a first node and a first power terminal. The second driver transistor has the drain and source terminals thereof connected between a second node and the first power terminal. The memory cell further includes a first variable threshold transistor having the drain and source terminals thereof connected between the first node and a third node and the gate terminal thereof connected to receive a control signal through a control node. There is included a second variable threshold transistor which has the drain and source terminals thereof connected between the second node and a fourth node with the gate terminal connected to the control node. A first current limiting device is connected between the third node and the second power terminal and a second current limiting device is connected between the fourth node and a second power terminal.

BRIEF DESCRIPTION OF THE FIGURE

For a more complete understanding of the present invention and the advantages thereof, reference is now made to the following Description taken in conjunction with the accompanying Drawing in which the FIGURE is a schematic illustration of a nonvolatile static random access memory cell in accordance with the present invention.

DETAILED DESCRIPTION

Referring now to the FIGURE there is shown a schematic illustration of a nonvolatile static random access memory (RAM) cell 10 in accordance with the present invention. The memory cell 10 includes a pair of cross-coupled driver transistors 12 and 14 in which the drain terminal of transistor 12 and the gate terminal of transistor 14 are connected to a node 16. The drain terminal of transistor 14 and the gate terminal of transistor 12 are connected to a node 18. The source terminals of transistors 12 and 14 are connected to a power terminal designated as ground.

An access transistor 20 has the drain and source terminals thereof connected between a bit line 22 and node 16. The gate terminal of transistor 20 is connected to a word line 24. An access transistor 26 has the drain and source terminals thereof connected between node 18 and a bit line 28. The gate terminal of transistor 26 is connected to a word line 30. The overall memory circuit which includes memory cell 10 receives memory addresses which are decoded to selectively activate the word lines 24 and 30 and the bit lines 22 and 28 to select the memory cell 10.

A variable threshold transistor 36 has the drain terminal thereof connected to a node 38, the source terminal thereof connected to node 16 and the gate terminal thereof connected to a control node 40. The control node 40 is connected to receive a set/reset (S/R) signal. A second variable threshold transistor 41 has the drain terminal thereof connected to a node 42, the source terminal thereof connected to node 18 and the gate terminal thereof connected to the control node 40. An example embodiment of the transistors 36 and 41 is described in an article by Johnson, William S., Berlagos, George; Renninger, Allan; Kuhn, Greg; and Ranganath, T.R., "A 16Kb Electrically Erasable Nonvolatile Memory", IEEE International Solid-State Circuits Conference, p. 152–153; February, 1980.

A depletion transistor 48 has the drain terminal thereof connected to a power terminal designated $V_{cc}$. The gate and source terminals of transistor 48 are connected to node 38. A depletion transistor 50 has the drain terminal thereof connected to $V_{cc}$ and the gate and drain terminals thereof connected to node 42. Transistors 48 and 50 serve as current-limiting devices. Polysilicon resistors can be substituted and serve in place of transistors 48 and 50.

Operation of the memory cell 10 of the present invention is now described in reference to the FIGURE. A typical supply voltage $V_{cc}$ is 5.0 volts. To perform a write operation with the memory cell 10 the word lines 24 and 30 are activated to render conductive the access transistors 20 and 26. Complementary voltage levels are input on the bit lines 22 and 28. These voltage levels are transmitted through the access transistors to nodes 16 and 18. The voltage levels at the nodes 16 and 18 serve to set the on/off condition of transistors 12 and 14 and thereby establish the state of the flip-flop comprising driver transistors 12 and 14. The access transistors 20 and 26 are then turned off leaving the data stored in the cross-coupled driver transistors 12 and 14.

The read operation for the memory circuit comprises activating the access transistors 20 and 26 which connects node 16 to bit line 22 and node 18 to bit line 28. The bit lines are then pulled to complementary states corresponding to the data state stored in the cross-coupled transistors 12 and 14. The access transistors 20 and 26 are then turned off.

The above description is that of a conventional volatile static memory cell. The S/R signal is preferably maintained at 5.0 volts for conventional operation but can be held at 0.0 volts. If power is no longer supplied to the driver transistors 12 and 14 the data state stored therein is lost.

Operation of the nonvolatile storage elements is now described. The transistors 36 and 41 are fabricated to be depletion devices and have essentially the same threshold voltages. Thus transistors 36 and 41 are conductive to some degree as long as the control mode 40 is maintained at or above 0 volts relative to nodes 16 and 18. The transistors 36 and 41 therefore do not interfere with the basic operation of the cross-coupled transistors 12 and 14.

In the save mode of operation the power supply $V_{cc}$ is maintained at 5.0 volts, the word lines are held at 0 volts and the S/R signal at node 40 is driven to 20 volts. Assume for example that the transistors 12 and 14 are set such that node 16 is at 5.0 volts and node 18 is at ground. This means that transistor 12 is turned off and transistor 14 is turned on. Since there is no current flow through transistor 12, node 38 will likewise be at approximately 5.0 volts. But since there is current flow through transistor 14, node 42 will be at approximately 0 volts. There will thus be a 20 volt differential between the gate and drain terminals of transistor 41 and a 15 volt differential between the gate and drain terminals of transistor 36. The transistors 36 and 41 are fabricated such that the 20 volt gate-to-drain voltage causes electrons to tunnel through the oxide between the floating gate of transistor 41 and the drain terminal thereof. This electron flow serves to charge the floating gate of transistor 41 and make it less of a depletion device which raises the threshold voltage. The 15 volt differential on the gate and drain terminals of transistor 36 is insufficient to cause a significant electron flow to the floating gate terminal thereof. The change in threshold voltage of transistor 41 serves to store the data state which had previously been read into the driver transistors 12 and 14. The S/R signal is then returned to the 0 volt state.

In the recall mode the word lines 24 and 30 are held at 0 volts, $V_{cc}$ is taken from 0 to 5 volts and the S/R signal is taken from 0 to 5 volts. Since the same bias voltage is applied to both of the transistors 36 and 41, transistor 36 will become conductive before transistor 41 since transistor 41 now has a higher threshold voltage. The current flow through transistor 36 serves to raise the voltage of node 16 to a high state thereby turning on transistor 14 which maintains node 18 at a low state. The low state at node 18 serves to turn off transistor 12 thereby maintaining the high voltage state at node 16. Thus, after the recall mode is completed the state of memory cell 10 is reestablished in the true rather than the complement form of the stored data state. As noted above certain prior art nonvolatile circuits must function to generate the complement of the stored data state thereby requiring additional processing steps to invert the data and bring it back to the true state.

In the reset mode the word lines 24 and 30 are maintained at 0 volts, the S/R signal is maintained at 0 volts and the power supply $V_{cc}$ is driven to 20 volts. This provides a high negative gate-to-drain bias on both of the transistors 36 and 41. This bias removes electrons which have been previously stored on the floating gate of the variable threshold transistors. This serves to return the transistors 36 and 41 to the initial, similar threshold voltages. The reset operation can be carried out on memory cell 10 without affecting the data state stored in the driver transistors 12 and 14.

In summary the present invention comprises a nonvolatile static RAM cell which can be driven by a control signal to store the data state of the cell for an extended period of time despite loss of supply power. Upon recall the memory cell is restored to the true data state or the stored data. Further, the memory cell can be reset without affecting the normal read and write operations.

Although one embodiment of the invention has been illustrated in the accompanying Drawings and described in the foregoing Detailed Description, it will be understood that the invention is not limited to the embodiment disclosed, but is capable of numerous rearrangements, modifications and substitutions without departing from the scope of the invention.

We claim:

1. A nonvolatile static random access memory cell, comprising:
    cross-coupled transistor means having first and second nodes which are maintained at complementary logic states;
    first and second current limiting means each having a first terminal thereof connected to a first power terminal;
    a first variable threshold transistor which forms the only single component connection between a second terminal of said first current limiting means and said first node, said first variable threshold transistor having a control terminal thereof connected to a control node; and
    a second variable threshold transistor which forms the only single component connection between a second terminal of said second current limiting means and said second node, said second variable threshold transistor having a control terminal thereof connected to said control node.

2. The memory cell recited in claim 1 wherein each of said variable threshold transistor comprises a floating gate field effect transistor having the gate terminal thereof connected to said control node, said first variable threshold transistor having the source and drain terminals thereof connected between said first current limiting means and said first node and said second variable threshold transistor having the source and drain terminals thereof connected between said second current limiting means and said second node.

3. The method recited in claim 2 including the step of resetting said variable threshold transistors by driving said power terminal to an increased voltage state and holding said control node at a common voltage state thereby driving the one of said variable threshold transistors having the shifted threshold voltage to having an initial threshold voltage.

4. A nonvolatile static random access memory as recited in claim 1 wherein said first and second current limiting means are polysilicon resistors.

5. A nonvolatile static random access memory cell, comprising:

first and second cross-coupled driver transistors having first and second stable states, said first drive transistor having the drain and source terminals thereof connected between a first node and a first power terminal and said second driver transistor having the drain and source terminals thereof connected between a second node and said first power terminal;

a first variable threshold transistor having the drain and source terminals thereof connected between said first node and a third node and the gate terminal thereof connected to a control node, said first variable threshold transistor forming the only single component connection between said first node and said third node;

a second variable threshold transistor having the drain and source terminals thereof connected between said second node and a fourth node and the gate terminal thereof connected to said control node, said second variable threshold transistor forming the only single component connection between said second node and said fourth node;

a first current limiting device connected between said third node and a second power terminal; and a second current limiting device connected between said fourth node and a second power terminal.

6. A method of operation for a nonvolatile static random access memory, comprising the steps of:

setting a pair of cross-coupled driver transistors to one of two data states by applying complementary voltage level logic signals to first and second nodes connected respectively to said driver transistors;

saving the data state stored in said cross-coupled transistors in a nonvolatile form by applying a control signal having a first state with a greater amplitude than said logic level signal to a control node connected to the gate terminals of first and second variable threshold transistors, said first variable threshold transistor having the drain and source terminals thereof connected between said first node and a first current limiting device, said second variable threshold transistor having the drain and source terminals thereof connected between said second node and a second current limiting device, said current limiting devices further connected to a power terminal, said control signal shifting the threshold voltage for one of said variable threshold transistors selected dependent on the data state stored in said cross-coupled transistors, said shifting of the voltage threshold of the selected one of said variable threshold transistors constituting nonvolatile data state storage;

recalling the nonvolatile data state stored in the selected one of said variable threshold transistors when supply power is applied to said power terminal and said control signal having a second state is applied to said control mode wherein said variable threshold transistors are driven to have different conductivities thereby charging one of said first or second nodes to set said cross-coupled transistors to the true state of said one data state originally stored in said cross-coupled transistor; and applying a voltage to said control node during reading and writing operations of the memory which is sufficient to form a conductive path between the drain and source terminals of said first and second variable threshold transistors respectively but less than said first state.

* * * * *